(12) United States Patent
Peng et al.

(10) Patent No.: US 8,536,665 B2
(45) Date of Patent: Sep. 17, 2013

(54) FABRICATION OF PIEZOELECTRIC SINGLE CRYSTALLINE THIN LAYER ON SILICON WAFER

(75) Inventors: Jue Peng, Hong Kong (CN); Chen Chao, Hong Kong (CN); Ji-yan Dai, Hong Kong (CN); Helen L. W. Chan, Hong Kong (CN)

(73) Assignee: The Hong Kong Polytechnic University, Hung Hoon, Kowloon (HK)

( * ) Notice: Subject to any disclaimer, the term of this patent is extended or adjusted under 35 U.S.C. 154(b) by 995 days.

(21) Appl. No.: 11/892,313

(22) Filed: Aug. 22, 2007

(65) Prior Publication Data
US 2009/0050987 A1    Feb. 26, 2009

(51) Int. Cl.
*H01L 29/84* (2006.01)
(52) U.S. Cl.
USPC ............ 257/416; 257/E27.006; 438/50
(58) Field of Classification Search
USPC .......... 257/295, 415, 416, 417, 419, 619, 257/E27.006, E21.208
See application file for complete search history.

(56) References Cited

U.S. PATENT DOCUMENTS

| | | | | |
|---|---|---|---|---|
| 5,446,329 A | * | 8/1995 | Nakahata et al. | 310/313 A |
| 5,838,089 A | * | 11/1998 | Dreifus et al. | 310/313 A |
| 5,998,907 A | * | 12/1999 | Taguchi et al. | 310/313 R |
| 6,334,247 B1 | * | 1/2002 | Beaman et al. | 29/842 |
| 7,091,650 B2 | | 8/2006 | Xu et al. | |
| 7,095,157 B2 | * | 8/2006 | Sung | 310/313 R |
| 2002/0170341 A1 | * | 11/2002 | Jakoby et al. | 73/54.24 |
| 2003/0122453 A1 | * | 7/2003 | Yamada et al. | 310/363 |
| 2007/0015978 A1 | * | 1/2007 | Kanayama et al. | 600/310 |
| 2007/0296306 A1 | * | 12/2007 | Hauser et al. | 310/313 R |

FOREIGN PATENT DOCUMENTS

WO    WO/2006/032335    * 3/2006

* cited by examiner

*Primary Examiner* — Vongsavanh Sengdara
(74) *Attorney, Agent, or Firm* — The Hong Kong Polytechnic University

(57) ABSTRACT

The present invention relates a method of fabricating a piezoelectric device through micromachining piezoelectric-on-silicon wafer. The wafers are constructed so that piezoelectric layer is a single wafer having a thin layer from 5 to 50 μm.

2 Claims, 5 Drawing Sheets

FABRICATION OF PIEZOELECTRIC SINGLE CRYSTALLINE THIN LAYER ON SILICON WAFER

BACKGROUND

Clinical applications of ultrasonic imaging are expanding as the operating frequency increases. Some new applications require frequencies higher than 30 MHz emerge, such as opthalmological and dermatologicial imaging, as well as intravascular imaging with probes mounted on catheter tips. High frequency ultrasonic transducer (HFUT) has thus been a growing research area in recent years. With the operating frequency increasing, however, conventional transducer machining techniques are facing more and more difficulties in handling the miniaturized element and inter-element dimensions. Piezoelectric micromachined ultrasonic transducers (pMUTs) have thus been investigated as a promising new approach. By employing the well-established MEMS technologies, pMUTs offer advantages such as size miniaturization, parallel processing, batch production with high precision, repeatability and yield, and low cost and possible realization of complete systems-on-a-chip.

Most of the piezoelectric MEMS devices reported are using piezoelectric PZT ceramic films, ZnO films, or PVDF films as the functional materials. The relaxor-based piezoelectric single crystal $(1-x)Pb(Mg_{1/3}Nb_{2/3})O_3-xPbTiO_3$ (PMN-PT), although possessing extraordinary piezoelectric properties, are rarely reported being used for this purpose because it is difficult to grow single crystalline PMN-PT thick films directly on silicon wafers.

It is an object of the present invention to combine a piezoelectric wafer and a silicon wafer through bonding and thinning the piezoelectric wafer.

DESCRIPTION

The present invention proposes fabrication methods to combine a piezoelectric wafer and a silicon wafer through bonding, and thinning the piezoelectric wafer via a hybrid thinning method.

These and other features, aspects, and advantages of the apparatus and methods of the present invention will become better understood from the following description, appended claims, and accompanying drawings where:

Figure 6A:
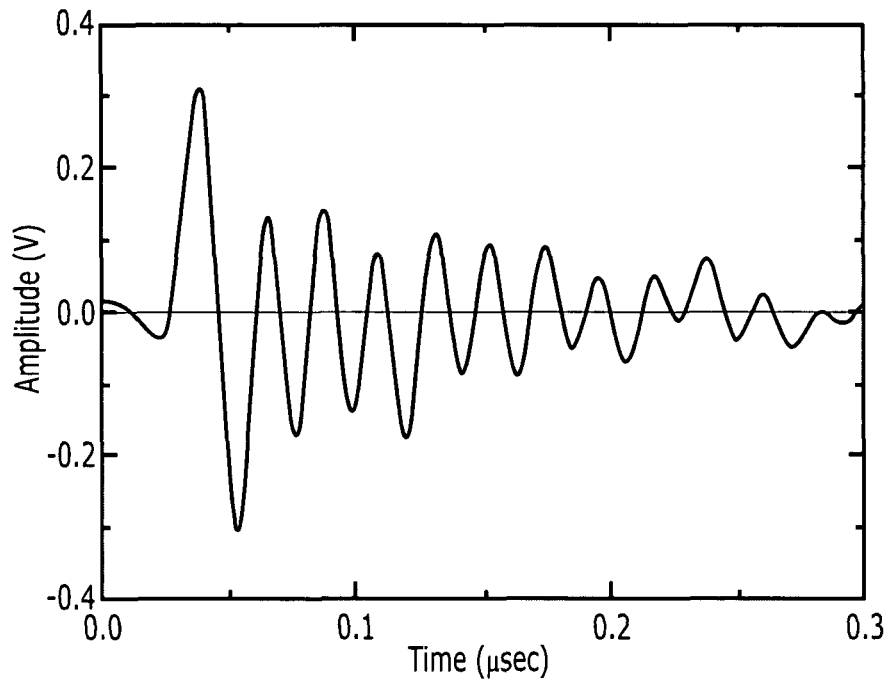
Figure 6B:
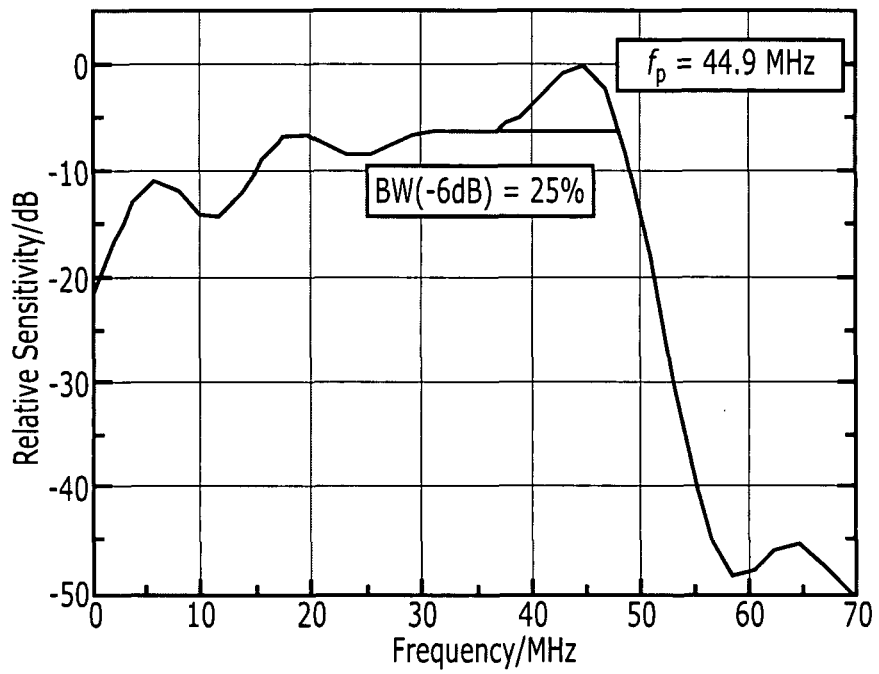

FIGS. 6(a) and (b) show ultrasonic pulse-echo measurement measured from the present piezoelectric device.

Figure 7:
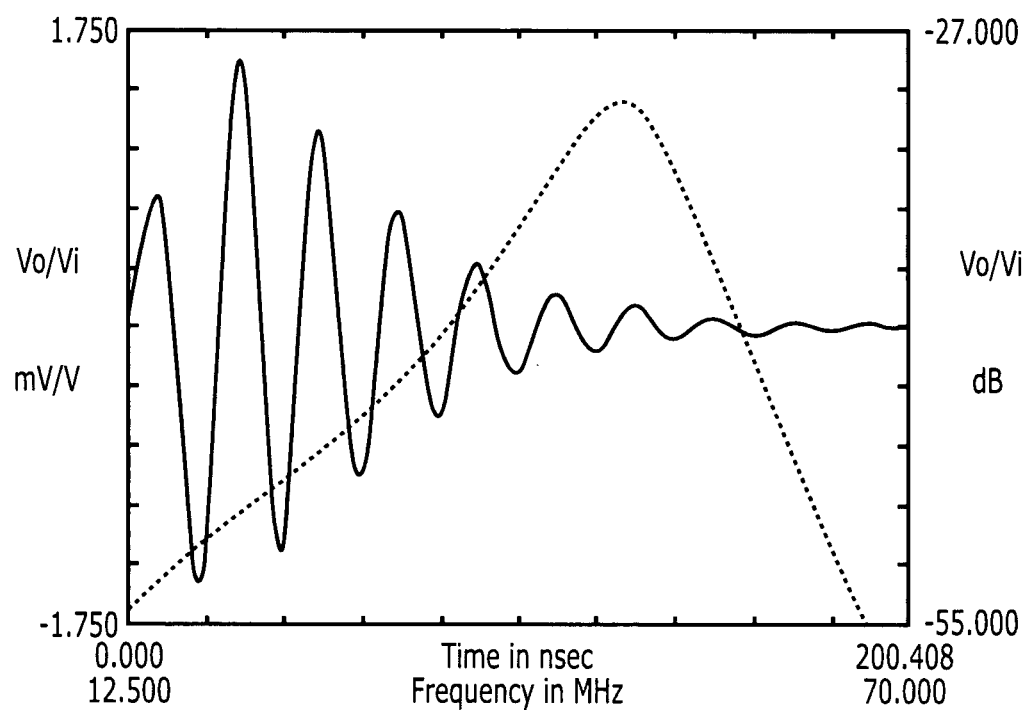

FIG. 7 shows graphs of simulated pulse echo response, frequency spectrum, and band width, as calculated by piezoCAD software, for the present piezoelectric device.

The following description of certain exemplary embodiment(s) is merely exemplary in nature and is in no way intended to limit the invention, its application, or uses.

Now, to FIGS. 1-8,

The present invention has as a purpose fabricating a piezoelectric device through micromachining piezoelectric-on-silicon wafers. The wafers are constructed so that the piezoelectric layer is a single piece having a thin layer from 5 to 50 µm.

Figure 1:
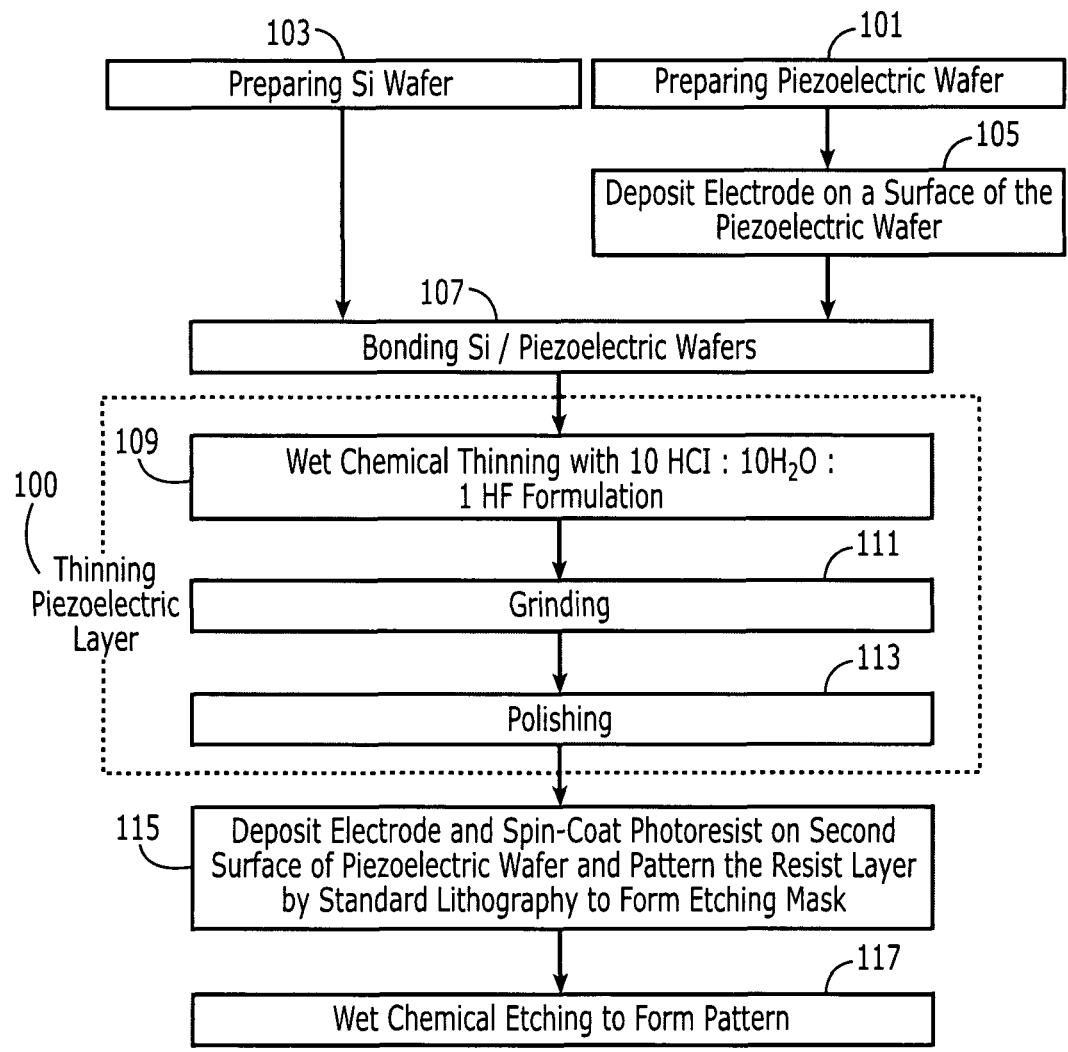
FIG. 1 shows an embodiment of fabricating a piezoelectric device.

FIG. 1 shows an embodiment of fabricating the piezoelectric device, including the steps of making silicon (Si)/piezoelectric wafers, thinning the piezoelectric wafer, and depositing electrodes.

In making the Si/piezoelectric wafer, the Si wafer 103 and piezoelectric wafer 101 are firstly prepared. Si wafer preparation 101 involves detaining a silicon block of approximately 400 µm in thickness. Piezoelectric wafer preparation 100 involves obtaining a piezoelectric block of approximately 200 µm thick.

To the piezoelectric wafer, an electrode is deposited thereon 105.

The piezoelectric wafers can be made of crystal of the formula $Pb(B^I B^{II})O_3-PbTiO_3$, where $B^I$ is $Mg^{2+}$, $Zn^{2+}$, $Sc^{3+}$, and $B^{II}$ is $Nb^{5+}$. The wafers can be made of powders having Pb or Bi compounds, including $PbTiO_3$ (PT), $Pb(Zr,Ti)O_3$, (PZT), $Bi_4Ti_3O_{12}$ and $ABi_4Ti_4O_{15}$ (Where A=Sr, Ba, or Ca). Examples of piezoelectrics used in the wafers include $Pb(Mg_{1/3}Nb_{2/3})O_3-PbTiO_3$(PMN-PT), $Pb(Ni_{1/3}Nb_{2/3})-PbTiO_3$(PNN-PT), $Pb(Co_{1/3}Nb_{2/3})O_3$, $Pb(Zn_{1/3}Nb_{2/3})-PbTiO_3$ (PZN-PT), $(Bi_{1/2}Na_{1/2})TiO_3$, and $Pb(Sc_{1/3}Nb_{2/3})O_3-PbTiO_3$(PSN-PT).

The Si wafer and piezoelectrics wafer are then bonded 107 to form a piezoelectric-on-silicon wafer. Prior to bonding, the piezoelectric wafer is coated with a metallic layer to serve as a common bottom electrode 105. Application is preferably by AU/Cr Sputtering.

The two wafers are bonded by means well-known in the art, including but not limited to eutectic bonding, soldering, or adhesive bonding. In the case of adhesive bonding, an epoxy phenol adhesive is preferably spun-on the silicon wafer. An example of the epoxy phenol is M-Bond 610 by SPI Supplies Division Structure Probe, Inc. Following application of the adhesive, the two wafers are bonded at between 150° C. to 200° C. under pressure for approximately 1 to 3 hours.

The piezoelectric wafer of the Si/piezoelectric wafer is then thinned 100. In order to achieve the desired thinness, the piezoelectric layer is thinned using a 3-step process: wet chemical thinning, grinding, and polishing. Wet chemical thinning 109 occurs by applying a chemical formulation of 10 $HCl:10H_2O:1HF$ to the piezoelectric layer. The desired thinness should be from 5 to 50 µm. Grinding 111 is accomplished by methods well-known in the art, for example those disclosed in U.S. Pat. No. 6,742,914, incorporated herein by reference. Polishing 113 can be applied by a variety of methods, such as dry tape polishing or wet polishing. The piezoelectric layer is then further thinned by wet chemical thinning. Electrodes are then deposited on the piezoelectric layer 109, and wet etching 111 is performed.

Figure 2:
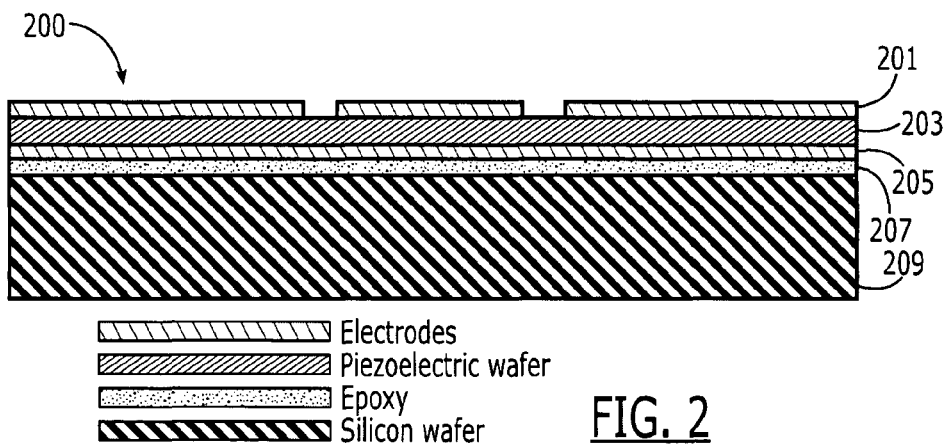
FIG. 2 shows as embodiment of the piezoelectric-on-silicon wafer fabricated in accordance with the present invention.
Figure 3:
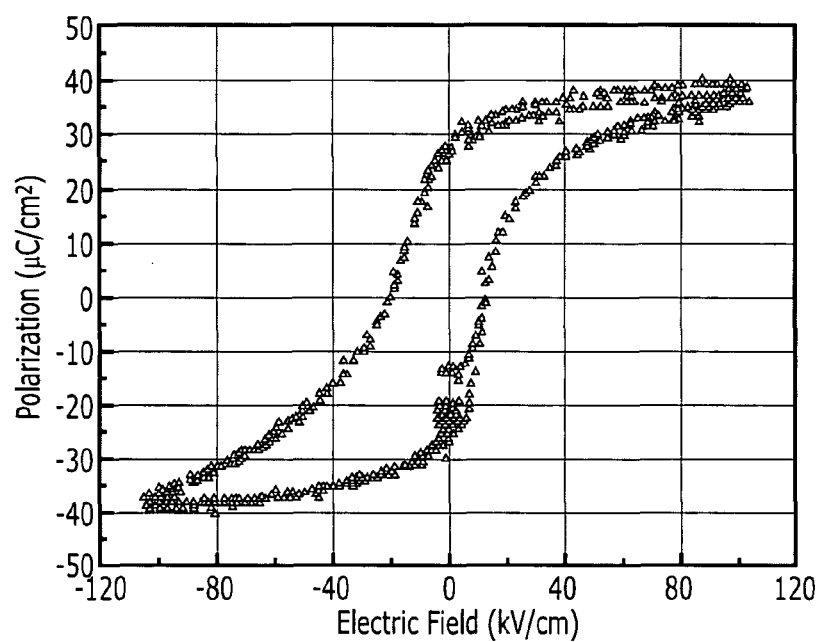
FIG. 3 shows a hysteresic loop as measured by analyzing a piezoelectric-on-silicon wafer of the present invention.

FIG. 2 is an embodiment of the piezoelectric-on-silicon wafer 200 made in accordance with the present invention. The wafer 200 includes a top electrode 201, a piezoelectric layer 203 made of single crystal having a thinness between 5-50 µm, a bottom electrode 205, an epoxy phenolic resin 207, and a silicon base 209.

The piezoelectric-on-silicon wafer of the present invention is suitable for use on micro-electromechanical device, for example micro-cantilevers, acoustic sensors, ultrasonic transducer, resonators, and pressure sensors. The wafer can be used with, for example, opthalmological imaging equipment, determatogical imaging equipment, and intravascular imaging equipment.

EXAMPLE

A 430 μm thick silicon wafer is bonded with a PMN-PT single crystal wafer of about 200 μm thick. To achieve lower process temperatures, spin-on M-Bond 610 adhesive (SPI Supplies Division Structure Probe, Inc.) was used for the purpose. Before bonding the PMN-PT wafer is pre-coated with a metallic layer as a common bottom electrode. The two wafers are adhesively bonded at 175° C. with light pressure for 2 hours. After mechanical grinding, polishing and wet chemical thinning with a 10HCl:10H$_2$O:1HF, PMN-PT layers with thickness ranging from 5 to 50 μm, depending on processing parameters, can be achieved on the silicon substrate.

In order to characterize the dielectric and piezoelectric properties of the single crystalline PMN-PT thick thin layer, top electrodes with various dimensions are deposited on the sample surface by using Au/Cr sputtering and photolithographic patterning. The sample is then connected through a probe station to a Agilent 4294 impedance analyzer and TF analyzer 2000 (for hysteresis loop measurement). The P-E hysteresis loop of the sample is measured and shown in FIG. 3. The remnant polarization P$_r$(~30 μC/cm$^2$) of the 16-micron-thick PMN-PT thin layer is comparable to that of bulk 0.70PMN-0.30PT single crystal, whereas the coercive electric filed E$_c$(~17.5 kV/cm) is much higher than that of bulk crystal (~2.4 kV/cm) at room temperature. This 'piezoelectric hardening' may be attributed to the strong substrate constrain. The thickness dependence of coercive field E$_c$ of PMN-PT which thin layers will be discussed elsewhere. The dielectric permittivity of $\in_{33}^T/\in_0$ (at 1 KHz) is 1416, measured according to the IEEE standards.

Fabricating Piezoelectric MEMS Devices

Figure 4:
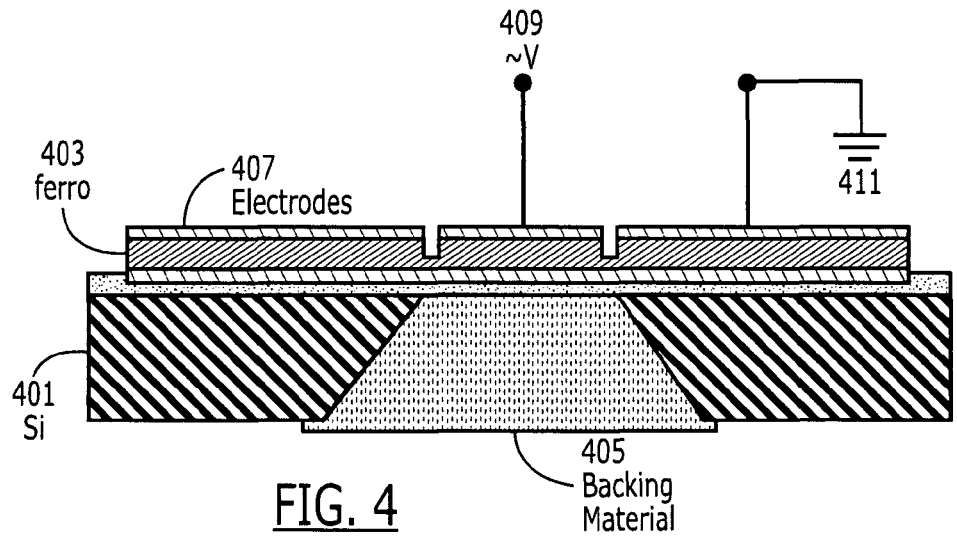
FIG. 4 shows the piezoelectric-on-silicon wafer as applied to the piezoelectric device.
Figure 5:
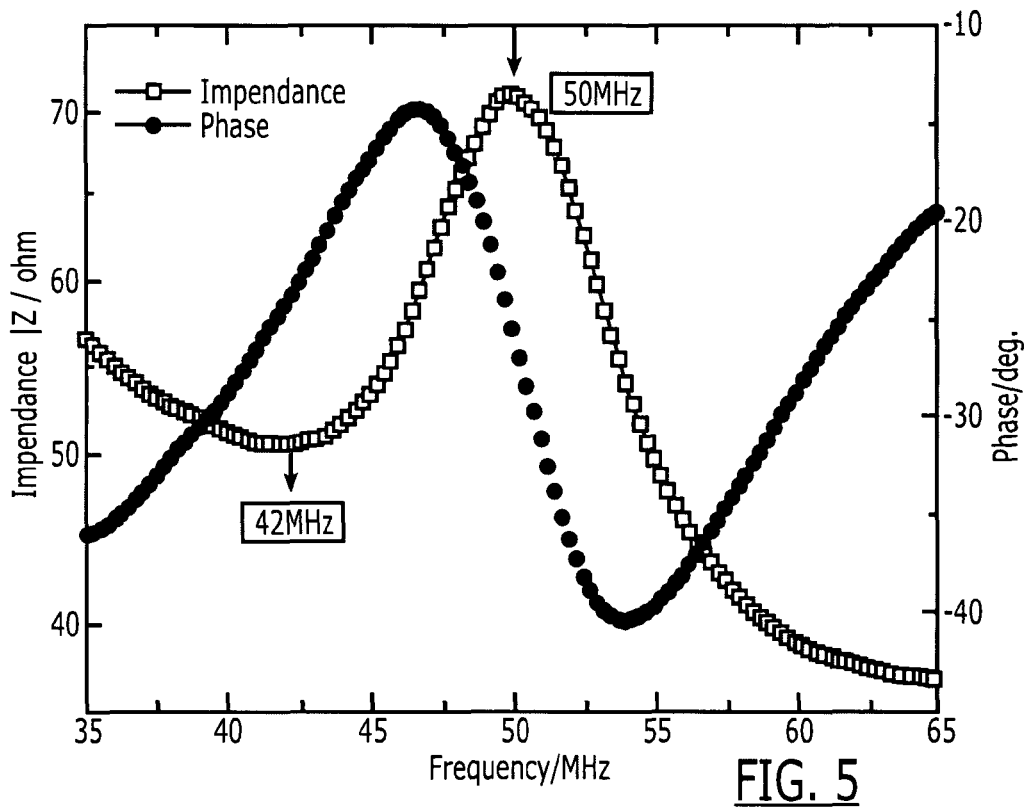
FIG. 5 shows the plot of phase angle versus frequency from the present piezoelectric devise as measured by an impedance analyzer.

A double-side polished silicon wafer (Si$_3$N$_4$/SiO$_2$/Si/SiO$_2$) with 40-micron-thick PMN-PT single crystal layer is used for the fabrication. The Si$_3$N$_4$ layer (200 nm) is serving as the etching mask during the backside silicon KOH anisotropic etching of Si$_3$N$_4$ and SiO$_2$ is done by RIE using SF$_6$+Ar gas to open up wet etching windows (2×2 mm$^2$) Through-wafer silicon etching is then achieved by using KOH anisotropic etching until PMN-PT single crystal membranes (1.3× 1.3 mm$^2$) are totally released. Cr/Au layers with 50 nm/150 nm thick are then sputtered and patterned on the PMN-PT membranes as top electrodes (0.7×0.7 mm$^2$) by using a double-side aligner (OAI). The top electrode defines the effective part of the transducer. The backside of the wafer is then coated with epoxy resin mixed with tungsten powder and hollow glass micro beads. After baking at 100° C. in vacuum for 2 hours, the epoxy resin composite fills into the silicon cavity uniformly and is hardened to form a backing material 405 whose acoustic impedance is about 6.23 Mrayls. The wafer is then diced into 5×5 mm$^2$ silicon dies. Each die carries a single element non-focused pMUT. Afterward, the silicon die is mounted on a small printed circuit board (PCB) and connected to a coaxial cable through wire bonding. The basic structure of the pMUT is schematically shown in FIG. 4.

The fabricated prototype pMUT is poled under DC 140 volts for 15 minutes at room temperature. The electric characteristics are measured by an Agilent 4294A impedance analyzer. The electric impedance, |Z|, and phase angle are plotted versus frequency in FIG. 5. The resonant frequency (fr) and the anti-resonance frequency (fa) are approximately at 42 MHz and 50 MHz, respectively. The electromechanical coupling coefficient (kt) is calculated as 58.2%, which is nearly equal to the value of bulk 0.70PMN-0.30PT single crystal. The electrical impedance is about 50 ohm at resonance, matching perfectly with the input impedance of the oscilloscopes. Dielectric permittivity $\in_{33}^T/\in_0$ at 1 kHz is found to be about 1446 at room temperature.

A pulser/receiver (Panametrics 5900PR) is used for ultrasonic pulse-echo measurement. A glass target is used as the reflector in a silicon oil tank at the standard measured distance. The received echo wave forms are displayed on an HP infinium oscilloscope (50 ohm coupling). A typical echo response of the pMUT is displayed in time domain and in frequency domain, as respectively shown in FIGS. 6(a) and (b). The echo wave form exhibited a noticeable long ring down due to the acoustic impedance mismatch between the PMN-PT thick film (32 Mrayls) and the silicon oil (1.0 Mrayl). The bandwidth at −6 dB was found to be about 25%. Further improvements shall include the deposition of an acoustic impedance matching layer on the front side of the wafer to increase the transducer sensitivity as well as to provide enough damping.

A Krimholtz-Leedom-Matthae (KLM) one dimensional equivalent circuit model simulation is also carried out by using PiezoCAD software (Version 3.03 for Windows, Sonic concepts, Wood-inville, Wash.). Graphs of simulated pulse echo response, frequency spectrum and bandwidth (at −6 dB about 28.6%) as calculated by the KLM model are shown in FIG. 7. The simulation results are in good agreement with actual experimental results.

Having described embodiments of the present system with reference to the accompanying drawings, it is to be understood that the present system is not limited to the precise embodiments, and that various changes and modifications may be effected therein by one having ordinary skill in the art without departing from the scope or spirit as defined in the appended claims.

In interpreting the appended claims, it should be understood that:

a) the word "comprising" does not exclude the presence of other elements or acts than those listed in the given claim;

b) the word "a" or "an" preceding an element does not exclude the presence of a plurality of such elements;

c) any reference signs in the claims do not limit their scope;

d) any of the disclosed devices or portions thereof may be combined together or separated into further portions unless specifically stated otherwise; and e) no specific sequence of acts or steps is intended to be required unless specifically indicated.

The invention claimed is:

1. A piezoelectric-on-silicon wafer comprising:
an etched top electrode and a bottom electrode;
a silicon base having Si$_3$N$_4$/SiO$_2$/Si/SiO$_2$ in which Si$_3$N$_4$ is an outer layer;
a piezoelectric layer being made of a single crystal with a thickness of 5 to 50 μm positioned between the etched top electrode and the bottom electrode; and
an epoxy phenolic resin layer positioned between said silicon base and said bottom electrode,
wherein the silicon base having a cavity beneath the etched top electrode, and width of the cavity is at least a width of the top electrode in which the cavity extends to the piezoelectric layer, and the cavity is filled with epoxy phenolic resin.

2. A piezoelectric-on-silicon wafer of claim 1, wherein said piezoelectric layer is one selected from the group consisting of Pb(Mg$_{1/3}$Nb$_{2/3}$)O$_3$—PbTiO$_3$, Pb(Ni$_{1/3}$Nb$_{2/3}$)—PbTiO$_3$, Pb(Co$_{1/3}$Nb$_{2/3}$)O$_3$, Pb(Zn$_{1/3}$Nb$_{2/3}$)—PbTiO$_3$, (Bi$_{1/2}$Na$_{1/2}$)TiO$_3$, and Pb(Sc$_{1/3}$Nb$_{2/3}$)O$_3$—PbTiO$_3$.

* * * * *